Nov. 24, 1970 R. P. FARNSWORTH 3,543,049
RAMP GENERATOR WITH CLAMP
Filed Aug. 26, 1968
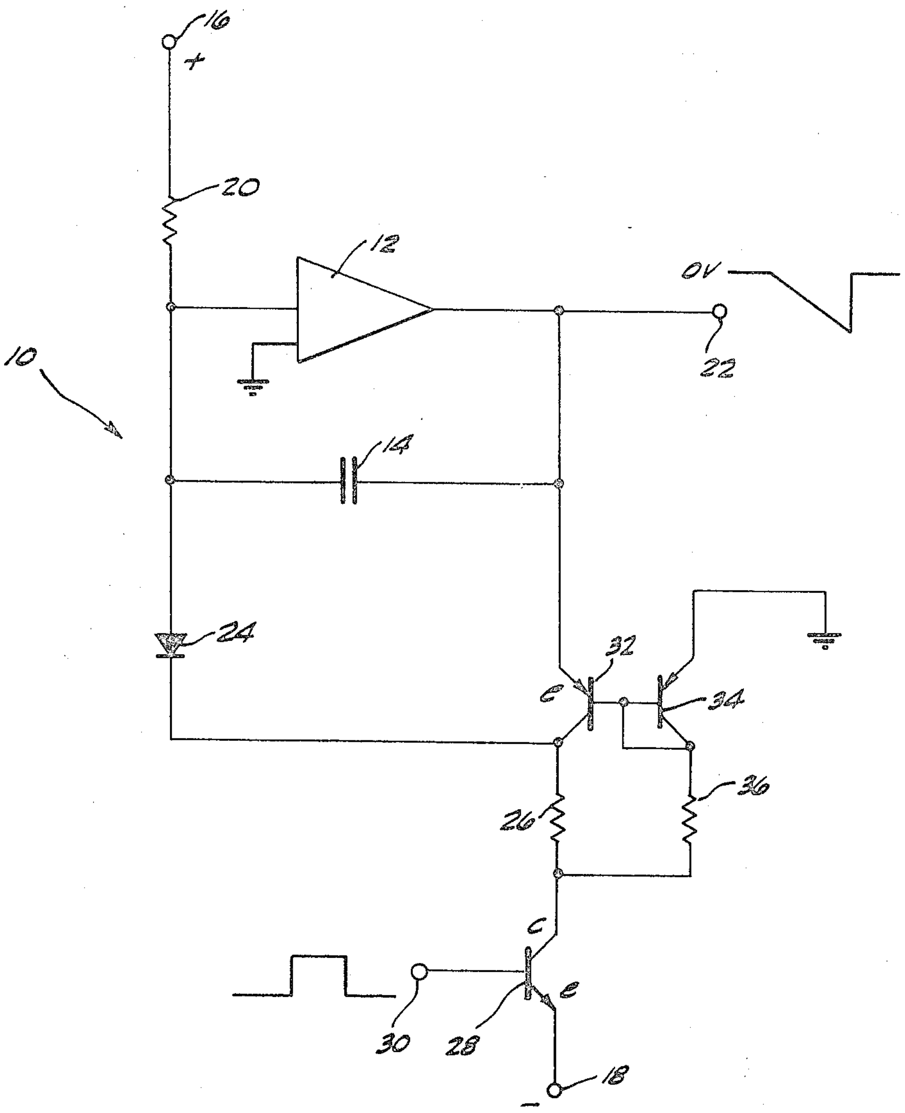
INVENTOR.
ROBERT P. FARNSWORTH,
BY
Allen A. Dicke, Jr.,
AGENT.

United States Patent Office 3,543,049

Patented Nov. 24, 1970

3,543,049

RAMP GENERATOR WITH CLAMP

Robert P. Farnsworth, Los Angeles, Calif., assignor to Hughes Aircraft Company, Culver City, Calif., a corporation of Delaware Filed Aug. 26, 1968, Ser. No. 755,467
Int. Cl. H03k *4/12, 5/08*
U.S. Cl. 307—228 6 Claims

ABSTRACT OF THE DISCLOSURE

An inverting operational amplifier is paralleled to a capacitor such that a current generator connected to the amplifier/capacitor input node produces a ramp voltage waveform at the amplifier output. A reverse of the polarity and a change of magnitude of the current generator discharges the capacitor, and when the desired level on the signal output side of the integrating capacitor is reached, back-to-back transistors bypass the current generator to clamp the signal output at the desired level.

The invention herein described was made in the course of or under a contract or subcontract thereunder, with U.S. Air Force, Department of Defense.

BACKGROUND

This invention is directed to a ramp generator with a clamping circuit which clamps the signal level between ramps at the desired level.

Ramp generators employing inverting operational amplifiers in parallel with capacitors are known in the art. In these prior art devices, the quiescent signal level between ramps is determined by simply shorting out the capacitor when the quiescent state was desired. However, different current flow in branches of the discharge circuit resulted in different levels of the quiescent state so that accurate ramp starting points could not be established. Such single-ended transistor or diode circuits to discharge the integrating capacitor parallel to the operational amplifier could not accomplish proper quiescent state voltages. When the quiescent state voltage is not at the proper level, the off-set error often introduces difficulties in the circuit for which the ramp was generated. For example, when the ramp is employed as a deflection voltage on a cathode ray tube, particularly such as a tube used for mosaic storage of video information, an off-set error or deviation of the quiescent voltage from the ideal results in undesirable spot displacement from the ideal. It is thus clear that minimized off-set error is desirable.

SUMMARY

In order to aid in the understanding of this invention it can be stated in essentially summary form that it is directed to a ramp generator with a clamp circuit which minimizes off-set error of the signal voltage during its quiescent state, between ramps. When ramps are generated by charging an integrating capacitor, the quiescent signal voltage between ramps is established by maintaining a charge or discharge current proportional to the difference between the desired voltage and the quiescent signal voltage and of such a polarity as to change the voltage on the integrating capacitor to decrease this difference. This is done through the use of a common base differential amplifier with each side conducting equal currents during the quiescent signal period. The currents are made equal by balancing current flow from the signal voltage and from the desired voltage through equal bias resistors in the collector circuits of the transistors. With the same voltage drop resulting across each base-emitter diode, the quiescent state voltage is clamped to the desired voltage.

Accordingly, it is an object of this invention to provide a ramp generator having a clamp circuit which clamps the quiescent state voltage between generated ramps at the desired level. It is another object to provide a clamp for such a ramp generator wherein clamping is accomplished through a common base differential amplifier by equating the quiescent voltage to the desired voltage by providing equal current flow through the differential transistors by causing equal voltage drops across equal resistors, one of said resistors being connected through a base-emitter junction to the desired voltage and the other through a base-emitter junction to the signal line. It is a further object to provide back-to-back transistors with common base connection so that emitter voltages are held equal when both of the transistors are conducting equal bias currents. Other objects and advantages of this invention will become apparent from a study of the following portion of the specification, the claims and the attached drawings.

DESCRIPTION OF THE DRAWINGS

The single figure of the drawings is an electrical schematic of the ramp generator with clamp circuit of this invention.

DESCRIPTION

The ramp generator with clamp circuit is generally indicated at 10 in the drawing. The circuit 10 includes both the ramp generator and the clamp circuit. The ramp generator comprises amplifier 12 across which is paralleled integrating capacitor 14.

Circuit 10 is connected to a positive voltage source 16 and negative source 18. Resistor 20 is connected between positive source 16 and the input to amplifier 12 and capacitor 14. With an uncharged capacitor 14, current flow through resistor 20 goes to the input of amplifier 12 and capacitor 14. However, amplifier 12 is a high gain inverting amplifier so that it has a very small input signal requirement. Thus, virtually all of the current through resistor 20 goes to charge capacitor 14, when no capacitor discharge circuitry is operative. Voltage rise on the positive side of capacitor 14 causes the voltage to rise on the signal input to amplifier 12 with the resultant negative going voltage with respect to time at output terminal 22 since the amplifier 12 is connected for inverting action. This negative going output also supplies the negative side of integrating capacitor 14.

A suitable amplifier to serve as amplifier 12 is the *u*A709 High Performance Operational Amplifier manufactured by Fairchild Semiconductor of Mountain View, Calif., as disclosed in the "Fairchild Semiconductor Linear Integrated Circuits Applications Handbook," copyright 1967, Library of Congress Catalog No. 67–27466. The amplifier is shown in that publication at pages 57 through 72.

The above-described structure will result in one negative going saw tooth or ramp, but no further action can be obtained until capacitor 14 is discharged to permit it to recharge for generating another saw tooth. The discharge means, together with the circuit which clamps the output terminal at the desired voltage between the ramps is comprised of the remainder of the circuitry shown in the drawing. It includes diode 24 which is connected between the input side of amplifier 12 and discharge resistor 26. Resistor 26 is in turn connected to the collector of NPN transistor 28. The emitter of transistor 28 is connected to negative source 18. The base of transistor 28 is connected to base drive terminal 30 which pulses the base of transistor 28 to a more positive, conductive state when it is desired that capacitor 14 be discharged and the voltage at output terminal 22 be returned to its quiescent state between ramps.

PNP transistor 32 has its emitter connected to the output of amplifier 12 and to the negative side of capacitor 14. It has its collector connected to the output of diode 24 and input of resistor 26. Transistor 34 is matched to transistor 32 as closely as is possible, for example, being diced out of the same chip, and has its emitter connected to a source of the desired level of the quiescent state between ramps at output terminal 22. This may be a type 2N4940, manufactured by Motorola Semiconductor, Inc. and described in "The Semiconductor Data Book," vol. 3, pages 11–47 to 11–48. In the illustrated case, the desired quiescent state is ground or zero volts with respect to terminals 16 and 18. Transistor 34 has its collector connected through resistance 36 to the collector of transistor 28, and resistors 26 and 36 are chosen to be as equal as possible. The bases of transistors 32 and 34 are connected together and are connected to the collector of transistor 34.

Assuming that output terminal 22 is substantially at zero volts or ground, which is the desired quiescent state, and transistor 28 is driven to be non-conductive, the current through resistor 20 charges integrating capacitor 14.

During the sweep, current through transistors 32 and 34, and through resistors 26 and 36 is zero due to cutoff of transistor 28. With no current through diode 24 or transistor 32, amplifier 12 feeds output terminal 22 with a negative going ramp in accordance with the charge buildup on the integrating capacitor.

When the ramp has extended to a sufficient excursion, or for a sufficient time, transistor switch 28 is driven into conduction by a positive going pulse on base drive terminal 30. This positive going pulse is maintained on the terminal as long as negative going saw tooth generation is not desired. This pulse drives transistor 28 into conduction, resulting in a current through resistor 26. Since the emitter of transistor 32 is at a negative voltage relative to ground potential, being at output ramp voltage, no current passes through transistor 32. Thus the current through resistor 26 passes through diode 24 providing a discharge current for the integrating capacitor 14.

When transistor 28 is conductive, there is also current flow through resistor 36 and transistor 34. This current is controlled to be equal to the current through resistor 26 because the base to collector drop of transistor 32 is nearly zero, despite the fact that transistor 32 may not be conducting. Thus, the voltage drop across resistors 26 and 36 is the same, despite the fact that the current through resistor 36 comes substantially from the ground point and the current through resistor 26 comes through diode 24 until transistor 32 becomes conductive.

As long as output terminal 22 is negative, that is as long as some of the negative sweep voltage is present at the emitter of transistor 32, the transistor 32 remains nonconductive. Thus, all of the current through resistor 26 comes through diode 24. This current is large compared to the current through resistor 20, thus causing a reverse current through capacitor 14. This discharge of capacitor 14 continues until the voltage at output terminal 22 is at the desired quiescent state, which in the illustration is ground voltage. When the voltage at output terminal 22 rises to the quiescent state, transistor 32 becomes conductive, for now the emitter-base junction is forward biased.

Steady state operation occurs when transistor 32 conducts sufficiently to supply the current difference between the current flow in resistor 26 and the current passing through resistor 20 and through diode 24, to indicate no change in charge on integrating capacitor 14.

The current through diode 24 makes up part of the current through resistor 26. The balance is made up of current supplied by amplifier 12 through transistor 32. When the voltage at the output of amplifier 12 rises, transistor 32 conducts more heavily causing diode 24 to become nonconductive. The current through resistor 20 charges integrating capacitor 14 causing the output 22 to return to ground potential. When the voltage drops to a value slightly below the desired quiescent state voltage, the emitter of transistor 32 becomes more negative than the emitter of transistor 34 reducing current flow in transistor 32. This causes a discharge current to flow into capacitor 14 resulting in the voltage at output terminal 22 returning to the desired quiescent level. It is clear that if the quiescent state between sweeps at the output terminal 22 is desired to be other than ground voltage, the emitter of transistor 34 could be connected to the desired value of quiescent voltage. It is the value of this emitter voltage that determines the quiescent state level.

The current through resistor 36 consists of the base currents of transistors 32 and 34 and the collector current of transistor 34. When the output signal 22 is clamped at the quiescent value, both transistors 32 and 34 will be conducting slightly out of saturation. The voltage across transistor 34 will be the base-emitter voltage required to cause the major portion of the current flowing in resistor 36 to flow in collector terminal of transistor 34. Since the bases of the two transistors 32 and 34 are tied together while the emitters are at the same voltage due to the operation of the clamp, both transistors will have equal collector current flow. The current in the collector of 32 must be the current in resistor 26 minus the current in resistor 20. The current in transistor 34 is the current in resistor 36 minus the base currents of 32 and 34.

The resultant offset voltage during the quiescent signal condition is therefore the unmatched basic offset in the matched transistors 32 and 34 (typically less than five millivolts) plus the difference in collector currents in the transistors 32, 34 multiplied by twice the grounded base input impedance at the operating current level. For the example illustrated this amounts to five to ten millivolts.

An example of the circuitry, as far as particular values for one mode of operation is given by the following values:

| Number | Name | Value |
|---|---|---|
| 12 | Amplifier | Fairchild uA709. |
| 14 | Integrating capacitor. | 1 microfarad metallized polycarbonate. |
| 16 | Positive source | +15 volts. |
| 18 | Negative source | −15 volts. |
| 20 | Resistor | 300,000 ohms±1%. |
| 24 | Diode | 1N3600. |
| 26 | Resistor | 680 ohms±1%. |
| 28 | Transistor | 2N2219. |
| 32 | do | ½ 2N4940 } 2N4990 |
| 34 | do | ½ 2N4940 } 2N4990 |
| 36 | Resistor | 680 ohms±1%. |

When the circuit is operated, by application of a pulse train of ten millisecond pulses at base drive terminal 30 of sufficient magnitude to operate transistor 28 between the conductive and non-conductive states, at a rate of 50 pulses per second, output terminal 22 carries a signal with a negative going ramp extending from the zero volt quiescent state to a value of minus five volts and the quiescent state voltage remains within 0.01 volt of desired zero volt ground, at 68° and remains within 0.015 volt over a temperature range pulse or minus 50° C. Thus, quiescent state voltage is accurately maintained.

This invention having been described in its preferred embodiment, it is clear that it is susceptible to numerous modifications and embodiments within the ability of those skilled in the art and without the exercise of the inventive faculty. Accordingly, the scope of this invention is defined by the scope of the following claims.

What is claimed is:

1. A ramp generator, said ramp generator comprising:
means for generating a plurality of successive ramps, and clamp means for clamping the voltage between the ramps substantially at a predetermined value;
said ramp generator comprising an amplifier having an input and an output, the output of said amplifier being connected to an output terminal whereat the generated ramp appears, and an integrating capacitor connected in parallel with said amplifier; and
said clamp means comprising first and second transistors having their bases connected together and connected to the collector of said second transistor, said first and second transistors being respectively connected to said output terminal and to a source of voltage at the predetermined voltage level, said first and second transistors being respectively connected to first and second resistors so that the conductivity of said first transistor is regulated to regulate the charge on said capacitor to maintain the output voltage at said output terminal substantially at the predetermined value.

2. The ramp generator of claim 1 wherein the input to said amplifier and the input to said capacitor is connected to said first resistor so that said capacitor can be discharged through said first resistor.

3. The ramp generator of claim 2 wherein a diode is connected between the input to said integrating capacitor and said first resistor so that current is permitted to flow through said first resistor only in the direction causing discharge of said integrating capacitor.

4. The ramp generator of claim 3 wherein said first and second resistors have their outputs connected together and connected to a switch, said switch being conductive when the predetermined voltage is desired at said output terminal.

5. The ramp generator of claim 4 wherein said first and second resistors are substantially equal, said first and second transistors are substantially equal.

6. The ramp generator of claim 5 wherein said amplifier is inverting and the ramp generated is a ramp which is negative going from a predetermined value substantially at ground level.

References Cited

UNITED STATES PATENTS

| | | | |
|---|---|---|---|
| 3,072,856 | 1/1963 | Close | 328—181 X |
| 3,450,898 | 6/1969 | Malan | 307—229 |
| 3,470,495 | 9/1969 | DeBoo | 328—127 X |

STANLEY D. MILLER, Primary Examiner

U.S. Cl. XR.

307—229, 237; 328—127, 181